(12) United States Patent
Kim et al.

(10) Patent No.: US 8,036,293 B1
(45) Date of Patent: Oct. 11, 2011

(54) METHOD AND APPARATUS FOR A MULTI-PROTOCOL XDSL LINE DRIVER

(75) Inventors: Chun-Sup Kim, San Jose, CA (US); Elango Pakriswamy, San Jose, CA (US); Luiz Felipe Fuks, Fremont, CA (US)

(73) Assignee: Ikanos Communications, Inc., Fremont, CA (US)

( * ) Notice: Subject to any disclaimer, the term of this patent is extended or adjusted under 35 U.S.C. 154(b) by 494 days.

(21) Appl. No.: 12/322,002

(22) Filed: Jan. 28, 2009

Related U.S. Application Data

(60) Provisional application No. 61/024,147, filed on Jan. 28, 2008.

(51) Int. Cl.
 *H04K 1/10* (2006.01)
 *H04L 27/28* (2006.01)
(52) U.S. Cl. ........ 375/260; 375/222; 375/297; 330/126; 330/124 D
(58) Field of Classification Search .................. 375/222, 375/260, 297; 330/126, 124 D
See application file for complete search history.

(56) References Cited

U.S. PATENT DOCUMENTS

| | | | |
|---|---|---|---|
| 5,878,332 A * | 3/1999 | Wang et al. | 455/84 |
| 6,853,244 B2 * | 2/2005 | Robinson et al. | 330/51 |

* cited by examiner

*Primary Examiner* — Curtis Odom
(74) *Attorney, Agent, or Firm* — IP Creators; Charles C Cary

(57) ABSTRACT

A transceiver having shared and discrete components forming a transmit path and a receive path configured to couple to a communication medium for establishing a multi-tone modulated communication channel thereon. The transceiver includes a line driver component on the transmit path. The line driver is configured to respond to a protocol determination and by configuring at least one of a transmit power level and a transmit bandwidth of the multi-tone modulated communication channel on the communication medium. The line driver includes a plurality of pre-amplifiers each exhibiting a combination of transmit power and bandwidth for amplification of a transmit signal modulated with a selected multi-tone modulation protocol. The line driver also includes a single output amplifier having an output coupled to the communication medium and an input switchably coupled to an output of a selected one of the plurality of pre-amplifiers in response to the protocol determination.

20 Claims, 5 Drawing Sheets

METHOD AND APPARATUS FOR A MULTI-PROTOCOL XDSL LINE DRIVER

CROSS REFERENCE TO RELATED APPLICATION

This application claims the benefit of prior filed Provisional Application No. 61/024,147 filed on Jan. 28, 2008 entitled "ADSL/VDSL Compatible Line Drivers" which is incorporated herein by reference in its entirety as if fully set forth herein.

BACKGROUND OF THE INVENTION

1. Field of Invention

The field of the present invention relates to multi-tone transceivers.

2. Description of the Related Art

Digital Subscriber Lines (DSL) technology and improvements thereon including: G.Lite, ADSL, VDSL, HDSL all of which are broadly identified as X-DSL have been developed to increase the effective bandwidth of existing subscriber line connections to high speed back bone networks developed by telecommunications companies. An X-DSL modem operates at frequencies higher than the voice band frequencies, thus an X-DSL modem may operate simultaneously with a voice band modem or a telephone conversation. Each new XDSL protocol raises the bandwidth requirements of subscriber lines. As the bandwidth requirements increase so too does the complexity of the modem components. Additionally, because of the enormous variation in loop loss in the individual subscriber lines to which the modem may be coupled the individual components of the modem transmit and receive path must be reconfigurable to match the available bandwidth on a selected subscriber line. For modems which implement the VDSL protocol for example, the length and quality of the subscriber line will determine whether all or a portion of the two upstream and two downstream communications ranges will be available. The sheer length of the line results in significant attenuation of the upper communication ranges rendering their use impractical. Even on shorter loops the presence of various topological features on the subscriber line such as: bridges, taps, jumpers and changes in wire gauge can also constrain bandwidth. In each instance it is critical in the line qualification phase to be able to inexpensively and quickly determine the topology of the subscriber line to which the modem is coupled.

What is needed is a modem with improved capabilities for responding to varying line qualification results.

SUMMARY OF THE INVENTION

A method and apparatus for a multi-protocol XDSL line driver is disclosed. The line driver supports multiple XDSL protocols with a minimum of on chip 'real estate' required for implementation. In an embodiment of the invention a transceiver having shared and discrete components forming a transmit path and a receive path configured to couple to a communication medium for establishing a multi-tone modulated communication channel thereon is disclosed. The transceiver includes a line driver component on the transmit path. The line driver is configured to respond to a protocol determination and by configuring at least one of a transmit power level and a transmit bandwidth of the multi-tone modulated communication channel on the communication medium. The line driver includes a plurality of pre-amplifiers and a single output amplifier. The plurality of pre-amplifiers each exhibiting a combination of transmit power and bandwidth for amplification of a corresponding multi-tone modulation protocol. The single output amplifier has an output coupled to the communication medium and an input switchably coupled to an output of a selected one of the plurality of pre-amplifiers in response to the protocol determination; thereby reducing line driver size and isolating switching from the communication medium.

In an alternate embodiment of the invention an apparatus is disclosed to couple to a communication medium for amplifying a multi-tone modulated communication channel thereon. The apparatus includes a line driver. The line driver is responsive to a protocol determination to configure at least one of a transmit power level and a transmit bandwidth of the multi-tone modulated communication channel on the communication medium. The line driver includes a plurality of pre-amplifiers and a single output amplifier. The plurality of pre-amplifiers each exhibit a combination of transmit power and bandwidth for amplification of a corresponding multi-tone modulation protocol. The single output amplifier has an output coupled to the communication medium and an input switchably coupled to an output of a selected one of the plurality of pre-amplifiers in response to the protocol determination; thereby reducing line driver size and isolating switching from the communication medium.

Related means and methods are also disclosed.

BRIEF DESCRIPTION OF THE DRAWINGS

These and other features and advantages of the present invention will become more apparent to those skilled in the art from the following detailed description in conjunction with the appended drawings in which.

DETAILED DESCRIPTION OF THE EMBODIMENTS

A method and apparatus is disclosed for crosstalk channel estimation among a plurality of digital subscriber lines each supporting multi-tone modulation of communications channels thereon. The line cards may be found in a central office, remote access terminal, business or home. The line cards may be coupled directly or indirectly to digital subscriber lines via one or more optical or wireless links. The line cards support communication channels with differing degrees of robustness for multi-tone protocols including: asymmetric digital subscriber line (ADSL); very high bit rate digital subscriber line (VDSL) and other orthogonal frequency division multiplexing (OFDM) plans including but not limited to the following:

TABLE 1

| Standard name | Common name | Downstream rate | Upstream rate |
|---|---|---|---|
| ANSI T1.413-1998 Issue 2 | ADSL | 8 Mbit/s | 1.0 Mbit/s |
| ITU G.992.1 | ADSL (G.DMT) | 8 Mbit/s | 1.0 Mbit/s |
| ITU G.992.1 Annex A | ADSL over POTS | 8 Mbit/s | 1.0 MBit/s |
| ITU G.992.1 Annex B | ADSL over ISDN | 8 Mbit/s | 1.0 MBit/s |
| ITU G.992.2 | ADSL Lite (G.Lite) | 1.5 Mbit/s | 0.5 Mbit/s |
| ITU G.992.3/4 | ADSL2 | 12 Mbit/s | 1.0 Mbit/s |
| ITU G.992.3/4 Annex J | ADSL2 | 12 Mbit/s | 3.5 Mbit/s |
| ITU G.992.3/4 Annex L | RE-ADSL2 | 5 Mbit/s | 0.8 Mbit/s |
| ITU G.992.5 | ADSL2+ | 24 Mbit/s | 1.0 Mbit/s |
| ITU G.992.5 Annex L[1] | RE-ADSL2+ | 24 Mbit/s | 1.0 Mbit/s |
| ITU G.992.5 Annex M | ADSL2+M | 24 Mbit/s | 3.5 Mbit/s |
| ITU G.993.1 | VDSL | | |
| ITU G.993.2 | VDSL 2 | | |
| IEEE 802.16e | WiMax | | |
| IEEE 802.20 | Mobile Broadband Wireless Access | 1 Mbit/s | 1 Mbit/s |

Figure 1:
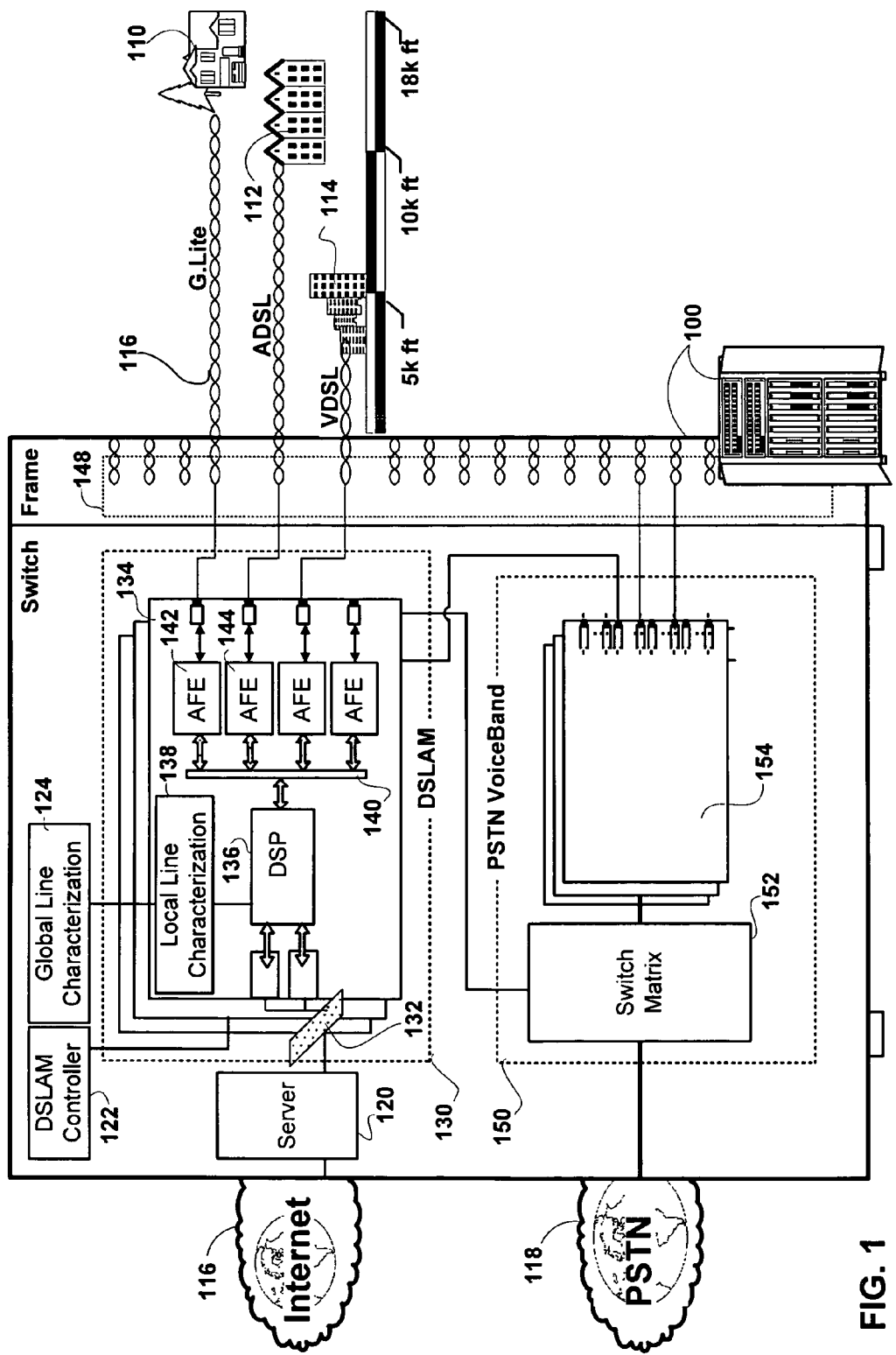
FIG. 1 is a system diagram of a multi-tone communication system in which individual subscribers are coupled via high speed communication links over public service telephone network (PSTN) subscriber lines with one residential and business customers.

FIG. 1 is a system diagram of a multi-tone communication system in which individual subscribers are coupled via high speed communication links over public service telephone network (PSTN) twisted copper subscriber lines with residential and business customers. The data communication is shown as various X-DSL protocols including G.Lite, ADSL and VDSL. Central Office (CO) 100 is coupled to a single residential customer 110 over a subscriber line 116 via a relatively narrowband G.Lite multi-tone modulated communications protocol. CO 100 is also coupled to residential complex 112 over another subscriber line via a relatively midband ADSL multi-tone modulated communications protocol. CO 100 is also coupled to business customer 114 over another subscriber line via a relatively broadband VDSL multi-tone modulated communications protocol. The terminology broadband, midband and narrowband refers to the frequency range called for by the corresponding multi-tone communication protocol for upstream and downstream communications between the subscriber and the CO. Representative frequency ranges for several multi-tone XDSL protocols are shown in the following FIG. 4.

Each of the CO subscriber connections 110-114 terminates in the frame room 148 of the CO. From this room connections are made for each subscriber line via splitters and hybrids to both a DSLAM 122 and to the voice band racks 150. The splitter shunts voice band communications to dedicated line cards, e.g. line card 154 or to a voice band modem pool (not shown). The splitter shunts higher frequency X-DSL communications on the subscriber line to a selected line card 134 within DSLAM 130. The line cards of the current invention are universal, meaning they can handle any current or evolving standard of X-DSL and may be upgraded on the fly to handle new standards.

Voice band call set up between subscribers on the public switched telephone network (PSTN) 118 is controlled by a Telco switch matrix 152 implementing a switching protocol such as the common channel signaling system 7 (SS7) for setting up and tearing down a connection via an associated one of the voice band line cards, e.g. line card 154. This makes point-to-point connections to other subscribers for voice band communications. The X-DSL communications may be processed by a universal line card such as line card 134. That line card includes a plurality of AFE's e.g. 142-144 each capable of supporting a plurality of subscriber lines. The AFEs may be coupled directly or as in this embodiment of the invention via a packet based bus 140 to a DSP 136 which is also capable of multi-protocol support for all subscriber lines to which the AFE's are coupled. The line card may include more than one DSP. Line Characterization and XDSL protocol determination between line cards and among the subscriber lines to which each line card is coupled is in an embodiment of the invention handled by a global line characterization module 124 and in another embodiment of the invention by local channel characterization and protocol determination modules, e.g. local line characterization module 138, on each line card. Each line card is coupled to a back-plane bus 132 which may in an embodiment of the invention be capable of offloading and transporting low latency X-DSL traffic between other DSPs for load balancing. Communications between AFE's and DSP(s) are in an embodiment of the invention packet based which allows a distributed architecture such as will be set forth in the following FIG. 2 to be implemented. Each of the DSLAM line cards operates as a multi-tone transceiver under the control of a DSLAM controller 122 which handles global provisioning, e.g. allocation of subscriber lines to AFE and DSP resources. Once an X-DSL connection is established between the subscriber and a selected one of the DSLAM sub modules, e.g. AFE and DSP, the subscriber will be able to access any network, e.g. the Internet 116, to which the DSLAM is connected via server 120.

Figure 2:
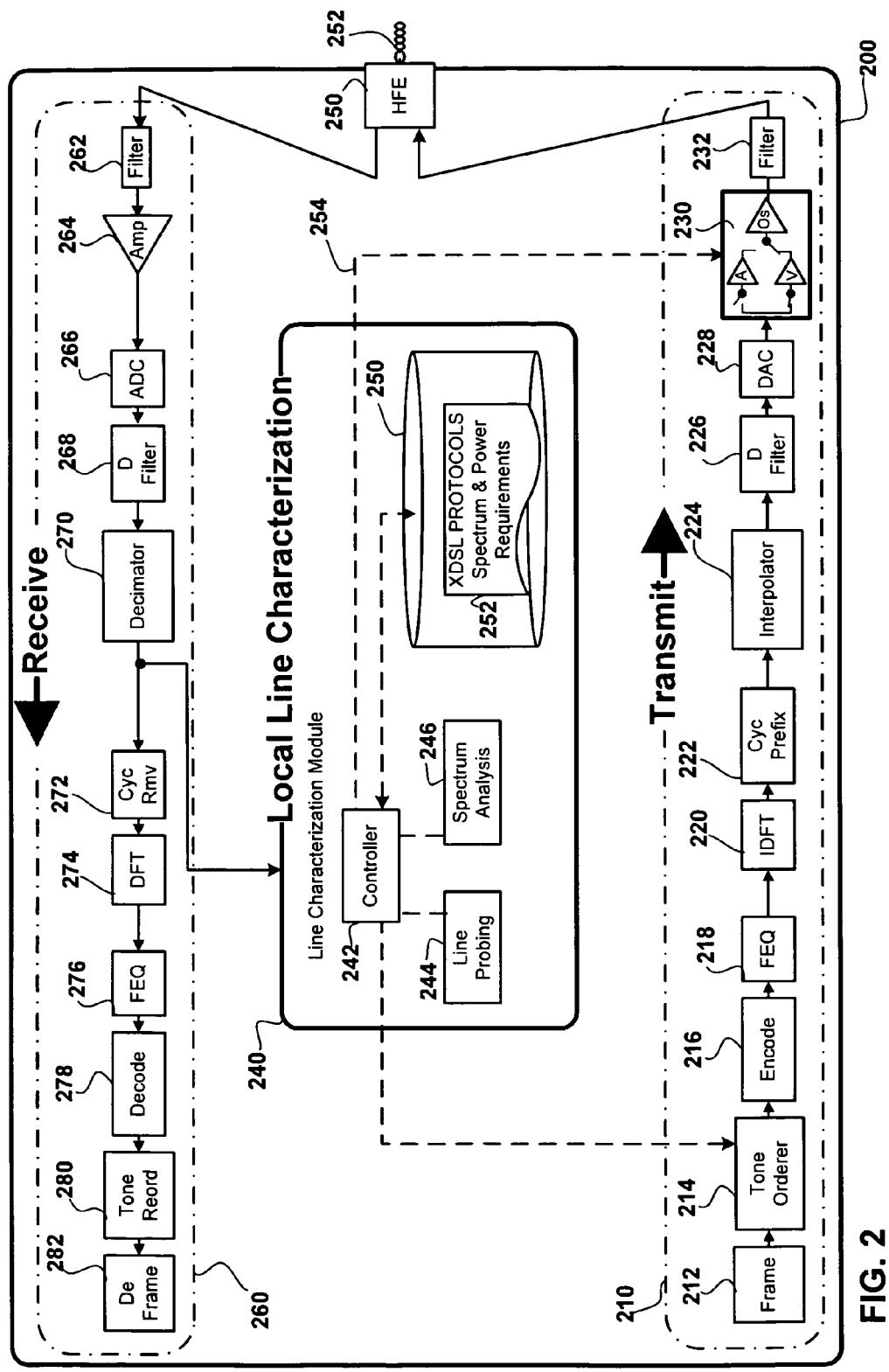
FIG. 2 is a hardware block diagram showing an embodiment of a transceiver of the current invention mounted on a line card in the central office shown in FIG. 1.

FIG. 2 is a hardware block diagram showing an XDSL transceiver 100 incorporating components for subscriber line characterization. The transceiver includes a plurality of shared and or discrete components coupled to one another to form a transmit path 210, a receive path 260, a local line characterization unit 240 and a hybrid front end (HFE) 250 which couples the transmit and receive paths of the modem to subscriber line 252.

The receive path 260 in this embodiment of the invention includes: analog filter 262, line amplifier 264, analog-to-digital converter (ADC) 266, digital filter 268, decimator 270, cyclic prefix remover 272, discrete Fourier transform engine (DFT) 274, frequency domain equalizer 276, decoder 278, tone re-orderer 280 and deframer 282. In operation received data of each communication channel is subject to analog filtration and amplification. The received data is then digitized in the ADC followed by digital filtration, if any. Next received data is subject to any required decimation in the decimator. Next the cyclic prefix or suffix of each data symbol is removed. Each symbol of data is then transformed from the time to the frequency domain in the DFT and subject to equalization in the frequency domain. Each symbol of data is then decoded in decoder and serialized in the tone re-orderer. The demodulated data is then de-framed in the de-framer and transferred to the ATM, Ethernet or other network to which the transceiver is coupled.

The transmit path 210 includes: framer 212, tone orderer 214, encoder 216, frequency domain equalizer 218, inverse discrete Fourier transform engine (IDFT) 220, cyclic prefix wrapper 222, interpolator 224, digital filter 226, digital-to-analog converter (DAC) 228, line driver 230 and filter 232. In operation transmitted data of each communication channel is framed in the framer, loaded bit by bit into corresponding tone bins by the tone-orderer, converted to a complex number representation of the corresponding point in the symbol constellation and subject to frequency domain equalization. Then each set of resultant tones, a.k.a. a symbol, is transformed from the frequency domain to the time domain in the IDFT. Subsequently any required cyclic suffix or prefix is added and the resultant data in the time domain is subject to interpolation in interpolator. After filtering in the digital filter the interpolated data is passed to the DAC. The DAC converts the digitized data of each communication channel to corresponding analog signals. These analog signals are introduced to the line driver. The line driver has a plurality pre-amplifiers a selected one of which is coupled to an output amplifier to provide the optimal power level and spectral coverage for the selected XDSL protocol. The output of the line driver is passed to analog filter and then via HFE 250 to subscriber line 252.

In an embodiment of the invention the transceiver also includes a local line characterization component 240 for determining the transmission characteristics of the communication medium, e.g. subscriber line, across which communications will be conducted, for selecting a XDSL communication protocol which matches those characteristics, e.g. broadband, midband, narrowband, and for configuring the transmit and receive path components accordingly.

The local line characterization component includes: one or more characterization units, e.g. line probing unit 244 and spectral analysis unit 246, coupled to a controller 242. The controller couples to storage 250 in which transmission requirements for various supported XDSL multi-tone communication protocols are stored.

One or more line characterization units working singly or collectively may be used to obtain information about the communication medium. In the embodiment of the invention shown in FIG. 2 the local line characterization units include at least one of: a line probing unit 244 and a spectral analysis unit 246.

The line probing unit 244 may employ single or double ended line probing (SELT) or (DELT) to determine transmission characteristics of the communication medium, e.g. subscriber line 252. These determined characteristics may include: line length and topology e.g. bridge taps, jumpers, end-of-line and changes in wire gauge. The line topology including line length; line features, including bridge taps, jumpers etc. are converted to the frequency domain and used to characterize insertion loss and other line characteristics such as nulled tones. These characteristics are then matched by the controller with the spectrum and power requirements of various of the XDSL protocols 252 in memory 250 and a determination is made as to which XDSL protocol will be used for modulating communications on the communication medium, e.g. subscriber line 252. Once the XDSL protocol is selected the transmit and receive path components of the modem are re-configured to optimize data transfer modulated with the selected XDSL protocol.

The spectral analysis unit 246 takes information derived during the training phase of operation, e.g. bit loading tables, signal to noise ratios (SNR) and gain tables to determine the transmit characteristics of the communication medium. These characteristics are then matched by the controller with the spectrum and power requirements of various of the XDSL protocols 252 in memory 250 and a determination is made as to which XDSL protocol will be used for modulating communications on the communication medium, e.g. subscriber line 252. Once the XDSL protocol is selected the transmit and receive path components of the modem are re-configured to optimize data transfer modulated with the selected XDSL protocol.

The line driver 230 of the current invention includes responsiveness to the protocol selection signal. In the embodiment of the invention shown in FIG. 2 the protocol selection signal 254 originates from the controller 244 of the a local line characterization component 240. This signal indicates the XDSL protocol selected by the controller which matches the transmission characteristics of the communication medium as determined by one or more of the line characterization unit(s) coupled to the controller. The line driver includes subcomponents which are configurable on a protocol specific basis in response to the protocol selection signal 254 from the local line characterization unit.

In an alternate embodiment of the invention the protocol selection signal 254 is generated based on criteria such as the protocol constraints of the remote modem or by the level of service paid for by the subscriber, rather than the characteristics of the subscriber line itself. In this embodiment of the invention the protocol selection signal may be generated by the Digital Subscriber Line Access Module (DSLAM) controller 122.

The hardware blocks shown in this and the following figures may be alternately implemented in software or firmware. The transmit and receive path described above and the scalable components thereof may be applied with equal advantage in embodiments of the invention where a plurality of XDSL channels are multiplexed on the transmit and receive path of the modem. The transmit and receive path components may be coupled to one another either by packet based transfer of successive packetized portions of a communication channel or by dedicated point-to-point coupling between components. In still another embodiment of the invention the line characterization processes may be implemented off card in a global line characterization unit, 124 (See FIG. 1).

The components shown in FIG. 2 collectively comprise a physical transceiver. In alternate embodiments of the invention the functions performed by the components may be implemented on a logical transceiver implemented on a combined digital signal processor (DSP) and analog front end (AFE) such as that shown on the line card 134 in FIG. 1.

Figure 3:
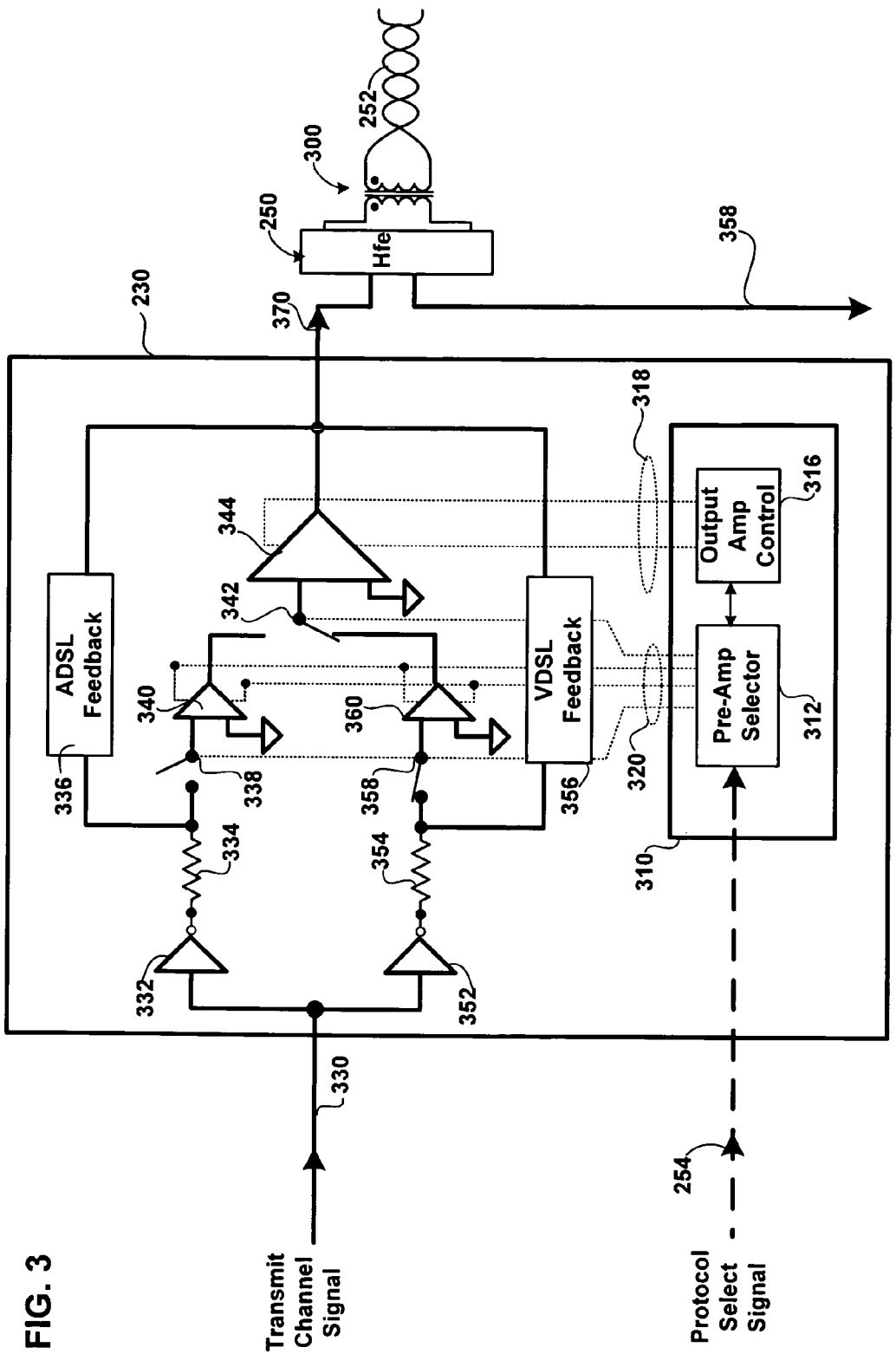
FIG. 3 is a detailed hardware block diagram of an embodiment of the configurable multi-protocol line driver portion of the transceiver shown in FIG. 2.

FIG. 3 is a detailed hardware block diagram of an embodiment of the configurable multi-protocol line driver 230 of the transceiver shown in FIG. 2. The line driver includes an input 330 coupled to the transmission path for receipt of the multi-tone modulated XDSL communication channel and an output 370 coupled via hybrid front end (HFE) 250 and transformer 300 to the communication medium, e.g. subscriber line 252. The HFE receives the amplified output of the transmitted signal over output 370 and passes the received signal on line 358 to the receive path components shown in FIG. 2. The line driver accepts a control input in the form of a protocol selection signal 254.

The line driver includes a plurality of pre-amplifiers switchably coupled to the input of an output amplifier to drive the transmitted signal 330 onto the communication medium 252. Two pre-amplifiers 340 and 360 are shown. Pre-amplifier 340 has transmission characteristics, e.g. frequency range and power level, suitable for transmission of a communication channel modulated with an ADSL communication protocol. Pre-amplifier 360 has transmission characteristics suitable for transmission of a communication channel modulated with a VDSL communication protocol. A selected one of the pre-amp's output is selectively coupled to the input of the output amplifier 344 via switch 342. In FIG. 3 the VDSL pre-amplifier 360 is coupled via switch 342 to the input of the output amplifier 344. Each pre-amp is also shown with a switched input. Switch 338 is shown open circuiting or decoupling the input to pre-amp 340 from both the transmit channel signal 330 via an associated buffer 332 and resistor 334 and from the ADSL feedback circuit 336. The uncoupling of this pre-amplifier avoids loading the output signal 370 with the feedback circuits of the unselected pre-amplifiers. Switch 358 is shown closed circuiting, or coupling the input to pre-amp 360 to the transmit channel signal 330 via an associated buffer 352 and resistor 354 and to the VDSL feedback circuit 356.

The line driver controller 310 is shown with a pre-amp selector module 312 and an output amp control 316. The line driver controller accepts as input the protocol selection signal 254. In response, the pre-amp selector sets the switches 338, 358, 342 into the appropriate configuration for coupling the selected one of the pre-amplifiers to the output amplifier and uncoupling remaining unselected pre-amplifiers there from. The pre-amplifier selector also drives the appropriate current/voltage onto the control inputs of the selected pre-amplifier. The output amplifier control 316 drives the appropriate current/voltage onto the control inputs of the output amplifier to conform to the requirements of the selected XDSL modulation protocol.

Figure 4:
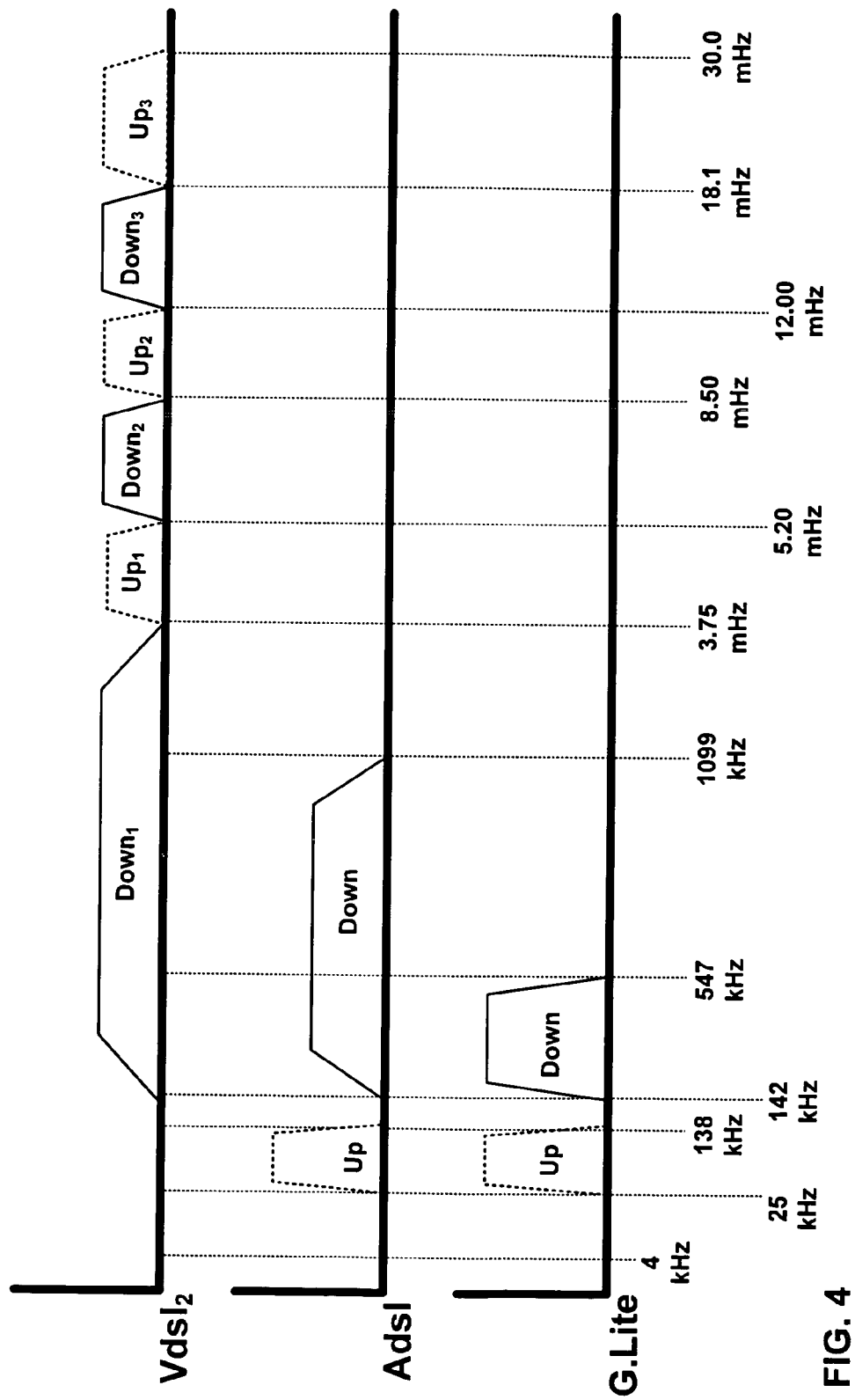
FIG. 4 is a graph showing representative bandwidth and bandwidth allocation of three representative multi-tone communication protocols supported by the line driver of an embodiment of the current invention.

FIG. 4 is a graph showing representative bandwidth and bandwidth allocation of three representative multi-tone communication protocols supported by the line driver of an embodiment of the current invention. The bandwidth requirements of three representative XDSL multi-tone communication protocols are shown. Specifically a broadband protocol, i.e. $VDSL_2$, with a frequency range from 142 kilo Hertz to 30 mega Hertz; a midband protocol, i.e. ADSL, with a frequency range from 25 kilo Hertz to approximately 1 mega Hertz; and a narrowband protocol, i.e. G.Lite, with a frequency range from 25 kilo Hertz to 547 kilo Hertz.

Figure 5:
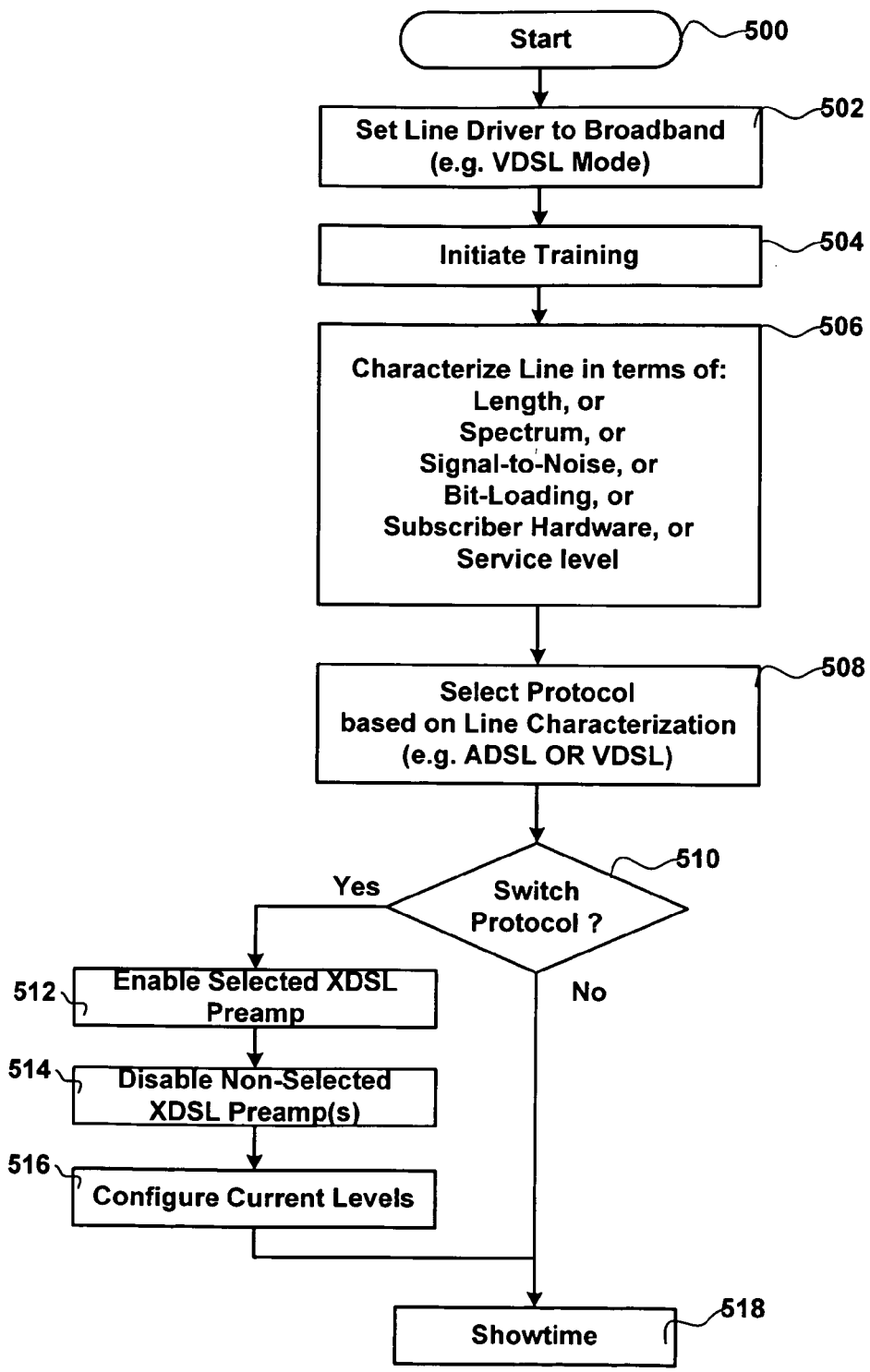
FIG. 5 is a process flow diagram of an embodiment of the processes associated with line driver configuration.

FIG. 5 is a process flow diagram of an embodiment of the processes associated with line driver configuration. After startup 500 control passes to process 502 in which the line driver is set to a broadband configuration, e.g. a VDSL2 communication protocol and associated band plan, for the onset of the training phase between the CO transceiver and a remote transceiver or modem to which it is coupled. Next training is initiated in process 504. Line characterization is then accomplished in process 506. Line characterization may be based on: line probing, or characteristics of the communication medium determined during training, or constraints independent of the capabilities of the communication medium, e.g. the actual hardware constraints of the remote modem or transceiver or the level of service contracted for by the subscriber. Once one or more of these characteristics are determined control is passed to process 508. In process 508 a multi-tone modulation protocol, such as ADSL or VDSL, is selected which matches the line characterization.

Then control passes decision process 510 in which a determination is made as to whether the selected protocol differs from the protocol utilized for training. If the protocols are the same, no re-configuration of the line driver is required and control passes to process 518 for the onset of showtime operation between the opposing transceivers on the CO and subscriber side. Alternately, if a determination is made that a protocol switch is required then control passes to processes 512-516. In process 512 the selected XDSL pre-amplifier is enabled by coupling its input to the transmit signal path and its output to the input of the output amplifier portion of the line driver. Then in process 514 the inputs and outputs of the remaining unselected pre-amplifiers are uncoupled or open circuited. Finally, in process 516 the output amplifier current or voltage inputs are driven to the correct values of current or voltage for the selected XDSL communication protocol. After the aforesaid re-configuration control also passes to the showtime phase of operation 518. In an alternate embodiment of the invention, the training phase may be extended after a line-driver reconfiguration to calibrate bit loading and power levels more accurately.

The foregoing description of a preferred embodiment of the invention has been presented for purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. A transceiver having shared and discrete components forming a transmit path and a receive path configured to couple to a communication medium for establishing a multi-tone modulated communication channel thereon, and the transceiver comprising:
   a line driver component on the transmit path responsive to a protocol determination to configure at least one of a transmit power level and a transmit bandwidth of the multi-tone modulated communication channel on the communication medium; and the line driver including:
      a plurality of pre-amplifiers each exhibiting a combination of transmit power and bandwidth for amplification of a corresponding multi-tone modulation protocol; and
      a single output amplifier having an output coupled to the communication medium and an input switchably coupled to an output of a selected one of the plurality of pre-amplifiers in response to the protocol determination; thereby reducing line driver size and isolating switching from the communication medium.

2. The transceiver of claim 1, further comprising:
   at least one output amplifier switch configured to switchably couple the input of the output amplifier to the output of a selected one of the plurality of pre-amplifiers; and
   at least one pre-amplifier switch configured to switchably couple an input of a selected one of the plurality of pre-amplifiers to the transmit signal path and to uncouple remaining unselected ones of the plurality of pre-amplifiers from the transmit signal path.

3. The transceiver of claim 1, further comprising:
   a plurality of feedback circuits each coupled between the output of the single output amplifier and an input of a corresponding one of the plurality of pre-amplifiers and each feedback circuit exhibiting a unique resistance for optimizing amplification of the selected one of the plurality of pre-amplifiers.

4. The transceiver of claim 1, further comprising:
   a line characterization module for characterizing the communication medium in terms of at least one of: line length; available bandwidth; spectral characteristics, signal-to-noise ratio (SNR) and bitloading and further for making a protocol determination of an optimal multi-tone modulation protocol matching the characteristics of the communication medium; and
   switches responsive to the protocol determination to couple the input of the single output amplifier to an output of a selected one of the plurality of pre-amplifiers which supports the optimal multi-tone modulation protocol, thereby matching the bandwidth and power requirements of the optimal multi-tone modulation protocol with a selected one of the plurality of pre-amplifiers which supports the multi-tone modulation protocol.

5. The transceiver of claim 1, wherein the corresponding multi-tone modulation protocols supported by associated ones of the plurality of pre-amplifiers include at least two of: ADSL, VDSL and G.Lite.

6. The transceiver of claim 1, wherein the communication medium comprises a wired subscriber line.

7. A apparatus configured to couple to a communication medium for amplifying a multi-tone modulated communication channel thereon; and the apparatus comprising:

a line driver responsive to a protocol determination to configure at least one of a transmit power level and a transmit bandwidth of the multi-tone modulated communication channel on the communication medium; and the line driver including:
   a plurality of pre-amplifiers each exhibiting a combination of transmit power and bandwidth for amplification of a corresponding multi-tone modulation protocol; and
   a single output amplifier having an output coupled to the communication medium and an input switchably coupled to an output of a selected one of the plurality of pre-amplifiers in response to the protocol determination; thereby reducing line driver size and isolating switching from the communication medium.

8. The apparatus of claim 7, further comprising:
at least one output amplifier switch configured to switchably couple the input of the output amplifier to the output of a selected one of the plurality of pre-amplifiers; and
at least one pre-amplifier switch configured to switchably couple an input of a selected one of the plurality of pre-amplifiers to the transmit signal path and to uncouple remaining unselected ones of the plurality of pre-amplifiers from the transmit signal path.

9. The apparatus of claim 7, further comprising:
a plurality of feedback circuits each coupled between the output of the single output amplifier and an input of a corresponding one of the plurality of pre-amplifiers and each feedback circuit exhibiting a unique resistance for optimizing amplification of the selected one of the plurality of pre-amplifiers.

10. The apparatus of claim 7, further comprising:
a line characterization module for characterizing the communication medium in terms of at least one of: line length; available bandwidth; spectral characteristics, signal-to-noise ratio (SNR) and bitloading and further for making a protocol determination of an optimal multi-tone modulation protocol matching the characteristics of the communication medium; and
switches responsive to the protocol determination to couple the input of the single output amplifier to an output of a selected one of the plurality of pre-amplifiers which supports the optimal multi-tone modulation protocol, thereby matching the bandwidth and power requirements of the optimal multi-tone modulation protocol with a selected one of the plurality of pre-amplifiers which supports the multi-tone modulation protocol.

11. The apparatus of claim 7, wherein the corresponding multi-tone modulation protocols supported by associated ones of the plurality of pre-amplifiers include at least two of: ADSL, VDSL and G.Lite.

12. The apparatus of claim 7, wherein the communication medium comprises a wired subscriber line.

13. A method for operating a transceiver having shared and discrete components forming a transmit path and a receive path configured to couple to a communication medium for establishing a multi-tone modulated communication channel thereon, and the method comprising:
   providing on the transmit path a line driver component comprising a plurality of pre-amplifiers switchably coupled to an input of a common output amplifier;
   initiating a training phase with a remote transceiver by coupling an output of a selected broadband one of the plurality of pre-amplifiers to the input of the output amplifier for driving a training signal onto the communication medium;
   determining in the training phase an optimal multi-tone modulation protocol matching in required bandwidth the characteristics of the communication medium in the training phase; and
   switchably coupling a narrowband one of the plurality of pre-amplifiers to the input of the output amplifier and uncoupling the broadband one of the plurality of pre-amplifiers responsive to a determination in the determining act that the optimal multi-tone protocol requires a relatively narrowband communication spectrum.

14. The method of claim 13 wherein the determining act further comprises:
   characterizing the communication medium during the training phase in terms of at least one of: line length, available bandwidth, spectral characteristics, signal-to-noise ratio (SNR) and bitloading.

15. The method of claim 13 further comprising:
   providing a plurality of feedback circuits each coupled between an output of the common output amplifier and an input of a corresponding one of the plurality of pre-amplifiers and each feedback circuit exhibiting a unique resistance for optimizing amplification of the selected one of the plurality of pre-amplifiers.

16. The method of claim 13 wherein the corresponding multi-tone modulation protocols supported by associated ones of the plurality of pre-amplifiers include at least two of: ADSL, VDSL and G.Lite.

17. The method of claim 13 wherein the communication medium comprises a wired subscriber line.

18. A means for operating a transceiver having shared and discrete components forming a transmit path and a receive path configured to couple to a communication medium for establishing a multi-tone modulated communication channel thereon, and the method comprising:
   means for providing on the transmit path a line driver component comprising a plurality of pre-amplifiers switchably coupled to an input of a common output amplifier;
   means for initiating a training phase with a remote transceiver by coupling an output of a selected broadband one of the plurality of pre-amplifiers to the input of the output amplifier for driving a training signal onto the communication medium;
   means for determining in the training phase an optimal multi-tone modulation protocol matching in required bandwidth the characteristics of the communication medium in the training phase; and
   means for switchably coupling a narrowband one of the plurality of pre-amplifiers to the input of the output amplifier and uncoupling the broadband one of the plurality of pre-amplifiers responsive to a determination by the means for determining that the optimal multi-tone protocol requires a relatively narrowband communication spectrum.

19. The means for operating of claim 18 wherein the means for determining further comprises:
   means for characterizing the communication medium during the training phase in terms of at least one of: line length, available bandwidth, spectral characteristics, signal-to-noise ratio (SNR) and bitloading.

20. The means for operating of claim 18 further comprising:
   means for providing a plurality of feedback circuits each coupled between an output of the common output amplifier and an input of a corresponding one of the plurality of pre-amplifiers and each feedback circuit exhibiting a unique resistance for optimizing amplification of the selected one of the plurality of pre-amplifiers.

* * * * *